United States Patent
Sinha et al.

(10) Patent No.: US 8,432,201 B1
(45) Date of Patent: Apr. 30, 2013

(54) PHASE-LOCKED LOOP (PLL) CIRCUIT

(75) Inventors: Samaksh Sinha, Singapore (SG); Niti Gupta, Ghaziabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/475,946

(22) Filed: May 19, 2012

(51) Int. Cl.
*H03L 7/06* (2006.01)

(52) U.S. Cl.
USPC .......................................... 327/156; 327/147

(58) Field of Classification Search .................. 327/147, 327/156
See application file for complete search history.

(56) References Cited

U.S. PATENT DOCUMENTS

| | | | |
|---|---|---|---|
| 4,937,536 A | 6/1990 | Reinhardt et al. | |
| 7,439,784 B2 * | 10/2008 | Lin | 327/157 |
| 7,714,625 B2 | 5/2010 | Chatterjee et al. | |
| 7,834,707 B2 * | 11/2010 | Chien | 331/17 |
| 8,085,071 B2 * | 12/2011 | Higashi | 327/157 |
| 8,125,253 B2 * | 2/2012 | Goldman et al. | 327/156 |
| 8,368,442 B1 * | 2/2013 | Chen | 327/157 |
| 2010/0073051 A1 * | 3/2010 | Rao et al. | 327/157 |
| 2010/0213994 A1 * | 8/2010 | Haerle | 327/158 |
| 2011/0080199 A1 * | 4/2011 | Yen et al. | 327/157 |
| 2011/0102034 A1 * | 5/2011 | Haerle | 327/157 |
| 2012/0098581 A1 * | 4/2012 | Haerle | 327/157 |

* cited by examiner

*Primary Examiner* — Adam Houston
(74) *Attorney, Agent, or Firm* — Charles Bergere

(57) ABSTRACT

A phase-locked loop (PLL) generates an oscillator signal based on an input reference signal. A voltage-to-current oscillator converts generates the oscillator signal based on a control. A charge pump circuit generates the charge pump current based on an error (feedback) signal. A low pass filter generates the control voltage based on the charge pump current. A capacitor is connected to an input terminal of the low pass filter that is charged to a voltage level of the control voltage by the low pass filter when the PLL is switched OFF. The voltage across the capacitor is buffered and fed back to the low pass filter when the PLL is switched ON, to reduce time taken by the VCO to generate the oscillator signal. The PLL is used in an electronic circuit to reduce the wake-up time of the electronic circuit.

20 Claims, 2 Drawing Sheets

PHASE-LOCKED LOOP (PLL) CIRCUIT

BACKGROUND OF THE INVENTION

The present invention relates to phase-locked loop (PLL) circuits and, more particularly, to reducing frequency lock time in phase-locked loop (PLL) circuits.

Electronic circuits such as microprocessors, microcontroller units (MCUs), system-on-chips (SOCs), and application specific integrated circuits (ASICs) are widely used in portable devices including personal digital assistants (PDAs), cell phones, and other handheld devices. These devices use phase-locked loops (PLLs) that generate an oscillator signal based on an input reference signal. The oscillator signal has a phase and frequency that is directly proportional with the corresponding phase and frequency of the input reference signal. In communication systems, the oscillator signal is used for modulation and demodulation of a message signal. In electronic circuits, the oscillator signal is used as a clock signal for synchronous operation of internal circuitry.

FIG. 1 illustrates a schematic diagram of a conventional PLL 100. The PLL 100 includes a voltage-controlled oscillator (VCO) 102, a frequency divider 104, a phase-frequency detector (PFD) 106, a charge pump 108 and a low pass filter 110. The VCO 102 generates an oscillator signal based on a control voltage. The phase detector 106 is connected to the VCO 102 by way of the frequency divider 104 and compares the phase of the oscillator signal with that of an input reference signal to generate an error signal based on the detected phase difference. The frequency divider 104 provides a fraction of the oscillator signal to the phase detector 106. The charge pump 108 is connected to the phase detector 106 and the VCO 102. The charge pump 108 receives the error signal and generates a charge pump current. The low pass filter 110, which is connected between the charge pump circuit 108 and the VCO 102, receives the charge pump current and generates the control voltage ($V_{ctrl}$), which is then provided to the VCO 102 that turn generates the oscillator signal.

The oscillator signal generated by the PLL 100 is provided as a clock signal to an electronic circuit (not shown). Electronic circuits are often required to operate on a low supply voltage and consume less battery power to increase the operating life, and hence are frequently switched from a RUN mode to a LOW POWER mode, during periods of inactivity. A wake-up circuitry is provided in the electronic circuit to switch the electronic circuit from the LOW POWER mode to the RUN mode. The PLL 100 is switched OFF when the electronic circuit enters the LOW POWER mode and is switched ON when the electronic circuit wakes up from the LOW POWER mode and enters the RUN mode. After switching ON, the PLL 100 takes a finite time to reach the locking frequency (referred to as frequency lock time). For low bandwidth PLLs, the frequency lock time is quite high (about 100 µs) and considerably increases the wake-up time (time taken by the electronic circuit to transition from the LOW POWER mode to the RUN mode) of the electronic circuit. A high wake-up time degrades the performance of the electronic circuit. Wake-up time becomes crucial when such electronic circuits are used in time-critical applications and must be kept as low as possible to reduce the chances of failure of the electronic circuit.

Therefore, it would be advantageous to have a PLL with a reduced frequency lock time. It would be further advantageous to have a PLL that can be used with an electronic circuit and that reduces the wake-up time of the electronic circuit and eliminates the above mentioned shortcomings of existing PLLs.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
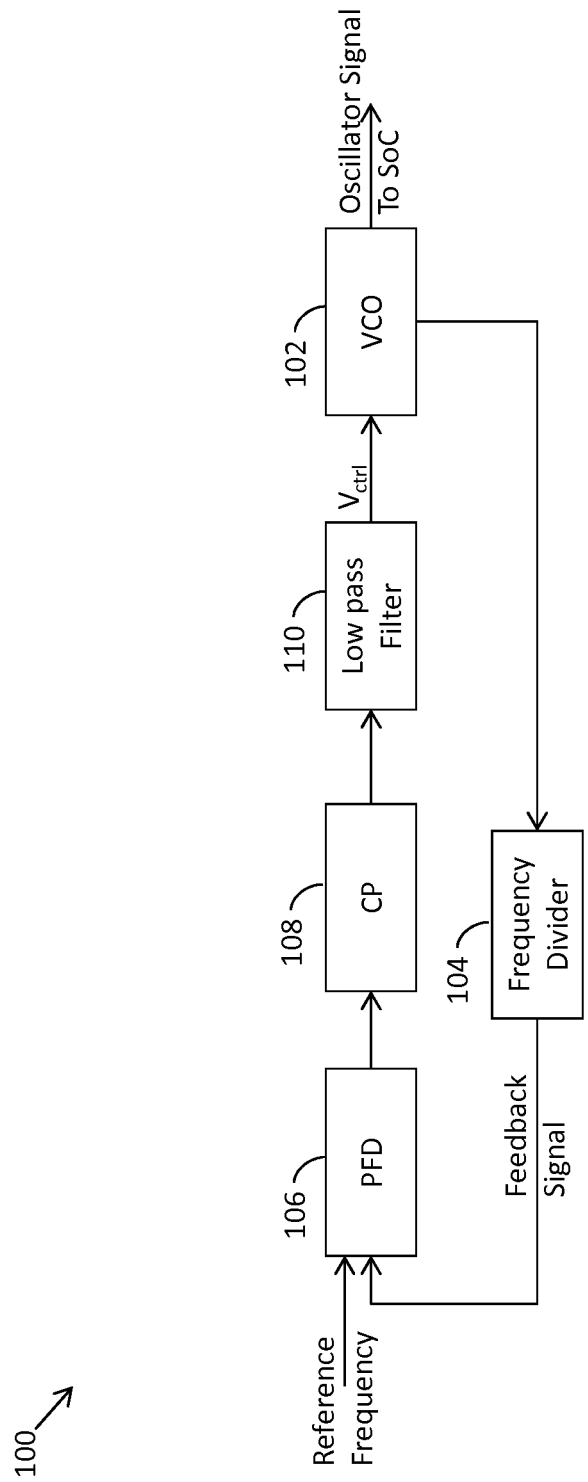
FIG. 1 is a schematic diagram of a conventional phase locked loop (PLL)

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a phase-locked loop (PLL) for generating an oscillator signal is provided. The PLL includes a phase-frequency detector (PFD) for generating an error signal based on an input reference signal and a feedback signal. A charge pump is connected to the PFD and generates a charge pump current based on the error signal. An input terminal of a low pass filter is connected to the charge pump. The low pass filter generates a control voltage based on the charge pump current. A voltage-controlled oscillator (VCO) is connected to an output terminal of the low pass filter and generates the oscillator signal based on the control voltage. A frequency divider is connected between the VCO and the PFD and generates the feedback signal by adjusting a frequency of the oscillator signal. The PLL further includes a capacitor having a first terminal connected to the output terminal of the low pass filter and a second terminal connected to ground. The capacitor is charged to about a voltage level of the control voltage by the low pass filter. An input terminal of a buffer amplifier is connected to the first terminal of the capacitor for buffering a voltage across the capacitor, and an output terminal thereof is connected to the input terminal of the low pass filter. The voltage across the capacitor is provided to the low pass filter when the PLL transitions from a STOP mode to a RUN mode and the time taken by the VCO to generate the oscillator signal is reduced.

In another embodiment of the present invention, an electronic circuit is provided. The electronic circuit includes a phase-locked loop (PLL) for generating and providing an oscillator signal to the electronic circuit. The PLL is switched OFF when the electronic circuit is in a LOW POWER mode and switched ON when the electronic circuit transitions from the LOW POWER mode to a RUN mode and includes a phase-frequency detector (PFD) for generating an error signal based on an input reference signal and a feedback signal. A charge pump is connected to the PFD and generates a charge pump current based on the error signal. An input terminal of a low pass filter is connected to the charge pump. The low pass filter generates a control voltage based on the charge pump current. A voltage-controlled oscillator (VCO) is connected to an output terminal of the low pass filter and generates the oscillator signal based on the control voltage. A frequency divider is connected between the VCO and the PFD and generates the feedback signal by adjusting a frequency of the oscillator signal. The PLL further includes a capacitor having a first terminal connected to the output terminal of the low pass filter and a second terminal connected to ground. The capacitor is charged to about a voltage level of the control voltage by the low pass filter. An input terminal of a buffer amplifier is connected to the first terminal of the capacitor for buffering a voltage across the capacitor, and an output terminal thereof is connected to the input terminal of the low pass filter. The voltage across the capacitor is provided to the low pass filter when the PLL is switched ON and the time taken by the VCO to generate the oscillator signal is reduced, thereby reducing the time taken by the electronic circuit to transition from the LOW POWER mode to the RUN mode.

In yet another embodiment of the present invention, a phase-locked loop (PLL) for generating an oscillator signal is provided. The PLL includes a phase-frequency detector (PFD) for generating an error signal based on an input reference signal and a feedback signal. A charge pump is connected to the PFD and generates a charge pump current based on the error signal. An input terminal of a low pass filter is connected to the charge pump. The low pass filter generates a control voltage based on the charge pump current. A voltage-controlled oscillator (VCO) is connected to an output terminal of the low pass filter and generates the oscillator signal based on the control voltage. A frequency divider is connected between the VCO and the PFD and generates the feedback signal by adjusting a frequency of the oscillator signal. The PLL further includes a capacitor having a first terminal connected to the output terminal of the low pass filter and a second terminal connected to ground. The capacitor is charged to about a voltage level of the control voltage by the low pass filter. An input terminal of a buffer amplifier is connected to the first terminal of the capacitor for buffering a voltage across the capacitor, and an output terminal thereof is connected to the input terminal of the low pass filter. The voltage across the capacitor is provided to the low pass filter when the PLL transitions from a STOP mode to a RUN mode, to reduce the time taken by the VCO to generate the oscillator signal.

The PLL further includes a band gap voltage source for generating a band gap voltage. An input terminal of a comparator circuit is connected to the first terminal of the capacitor and an inverted terminal is connected to the band gap voltage source. An input terminal of a state machine is connected to an output terminal of the comparator circuit. The state machine generates one or more calibration bits based on a difference between the band gap voltage and the voltage across the capacitor. One or more switches are connected to corresponding one or more calibration bits, for selectively providing a compensation current to the first terminal of the capacitor, such that the compensation current compensates a charge leakage of the capacitor when the PLL is in the STOP mode.

Various embodiments of the present invention provide a PLL with a reduced frequency clock time. The PLL includes a capacitor and a buffer amplifier. The capacitor samples and stores the control voltage generated by the low pass filter, when the PLL is switched OFF. The buffer amplifier buffers the voltage across the capacitor and when the PLL is switched ON, the buffer amplifier feeds the buffered voltage back to the low pass filter and enables the PLL to achieve a faster frequency lock. Thus, the frequency lock time of the PLL is reduced. The PLL is used to provide an oscillator signal to an electronic circuit and is switched OFF when the electronic circuit enters a LOW POWER mode and is switched ON when the electronic circuit wakes up from the LOW POWER mode and enters a RUN mode. As the frequency lock time of the PLL is reduced, the PLL quickly locks to the input reference clock signal frequency, thereby enabling the electronic circuit to quickly transition from the LOW POWER mode to the RUN mode. Thus the wake-up time of the electronic circuit is reduced and the performance of the electronic circuit is improved.

Figure 2:
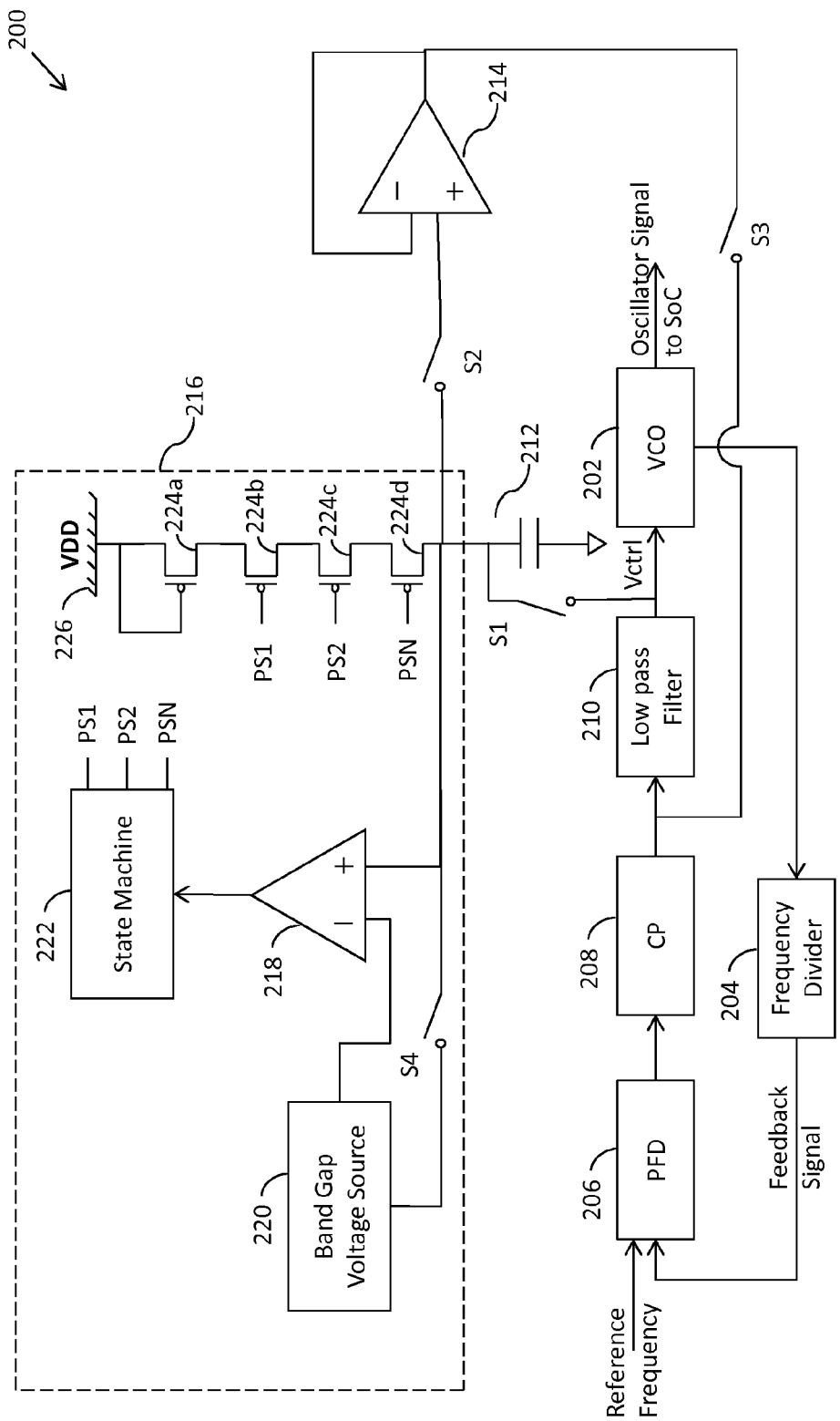
FIG. 2 is a schematic diagram of a PLL, in accordance with an embodiment of the present invention.

Referring now to FIG. 2, a schematic diagram of a PLL 200, in accordance with an embodiment of the present invention, is shown. THE PLL 200 includes a voltage-controlled oscillator (VCO) 202, a frequency divider 204, a phase-frequency detector (PFD) 206, a charge pump 208, and a low pass filter 210.

The VCO 202 generates an oscillator signal based on a control voltage. The PFD 206 is connected to the VCO 202 by way of the frequency divider 204 and compares the phase of the oscillator signal with that of an input reference signal to generate an error signal based on the detected phase difference. The frequency divider 204 provides a fraction of the oscillator signal to the PFD 206. The charge pump 208 is connected to the PFD 206 and the VCO 202. The charge pump 208 receives the error signal and generates a charge pump current. The low pass filter 210, which is connected between the charge pump circuit 208 and the VCO 202, receives the charge pump current and generates the control voltage, which is then provided to the VCO 202, which in turn generates the oscillator signal.

The PLL 200 is used with an electronic circuit (not shown) and provides the oscillator signal as a clock signal to the electronic circuit. The electronic circuit may be a microprocessor, a microcontroller, a system-on-chip (SoC), an application specific integrated circuit (ASIC), and the like and is capable of operating in a RUN mode and a LOW POWER mode. When the electronic circuit transitions from the RUN mode to the LOW POWER mode, the PLL 200 is switched OFF (or enters a STOP mode) and stops providing the oscillator signal to the electronic circuit. The PLL 200 is switched ON (or enters a RUN mode) to resume supply of the oscillator signal when the electronic circuit wakes up from the LOW POWER mode and enters the RUN mode.

To reduce the frequency lock time of the PLL 200, a capacitor 212 and a buffer amplifier 214 are provided. A first terminal of the capacitor 212 is connected to an output terminal of the low pass filter 210, by way of a first switch S1 and a second terminal of the capacitor 212 is grounded. The first terminal of the capacitor 212 is further connected to a positive terminal of the buffer amplifier 214 by way of a second switch S2. The negative terminal of the buffer amplifier 214 is shorted with an output terminal thereof. The output terminal of the buffer amplifier 214 is connected to the low pass filter 210 by way of a third switch S3.

In operation, when the electronic circuit enters the LOW POWER mode, the output of the PLL 200 (i.e., output of the VCO 202) is gated to cease the supply of oscillator signal to the electronic circuit. In various embodiments of the present invention, the PLL 200 receives a PLL_POWER_DOWN signal from the electronic circuit to trigger the gating. The PLL_POWER_DOWN signal simultaneously causes the first switch S1 to switch to an ON state and connects the first terminal of the capacitor 212 to the output of the low pass filter 210. The low pass filter 210 charges the capacitor 212 to about a voltage level of the control voltage, after which the first switch S1 is switched OFF. The gating of the PLL 200 ensures that jitters caused due to sampling of the control voltage across the capacitor 212 do not propagate in to the electronic circuit.

After the control voltage is sampled across the capacitor 212, the PLL 200 receives a DELAYED_CONTROL signal from the electronic circuit that causes the PLL 200 to switch OFF and simultaneously causes the second switch S2 to switch ON. The second switch S2 connects the first terminal of the capacitor 212 to the positive terminal of the buffer amplifier 214. In an embodiment of the present invention, the buffer amplifier 214 is a unity gain amplifier and buffers the voltage across the capacitor 212. When the electronic circuit wakes up from the LOW POWER mode, the PLL 200 receives a POWER_UP signal from the electronic circuit that causes the third switch S3 to switch ON. The voltage buffered by the buffer amplifier 214 is provided to the low pass filter 210 that causes the PLL 200 to achieve a fast frequency lock with the input reference signal frequency. Thereafter, the second and third switches, S2 and S3, are switched OFF and the PLL 200 achieves a fine lock with the input reference signal frequency and the electronic circuit enters the RUN mode. Thus, the frequency lock time of the PLL 200 and the wake-up time of the electronic circuit are reduced.

In various embodiments of the present invention, the voltage sampled across the capacitor 212 when the PLL 200 is switched OFF (i.e., when the electronic circuit operates in the LOW POWER mode) is prone to leakage and may drop below the level of the control voltage. To compensate for the charge leakage of the capacitor 212, the PLL 200 includes a charge compensation circuit 216. The charge compensation circuit 216 includes a voltage comparator circuit 218, a band gap voltage source 220, a state machine 222 and a plurality of series-connected metal-oxide semiconductor (MOS) switches including first through fourth MOS switches 224a-224d. A positive terminal of the voltage comparator circuit 218 is connected to the first terminal of the capacitor 212 and a negative terminal thereof is connected to the band gap voltage source 220. The band gap voltage source 220 may be a reference voltage generation circuit that generates a reference voltage that is equal to about the control voltage and is further connected to the first terminal of the capacitor 212 by way of a fourth switch S4. An output terminal of the voltage comparator circuit 218 is connected to the state machine 222.

The state machine 222 is programmed to generate calibration bits that are provided to corresponding gate terminals of the MOS switches 224b-224d, i.e., a first calibration bit is provided to a gate terminal of the second MOS switch 224b, the second calibration bit is provided to a gate terminal of the third MOS switch 224c, and so on. The gate terminal of the first MOS switch 224a is shorted with a source terminal thereof, and is further connected to a core voltage supply 226. A drain terminal of the fourth MOS switch 224d is connected to the first terminal of the capacitor 212. It will be understood by a person skilled in the art that the present invention is not limited to the use of four MOS switches 224 (as shown in FIG. 2) and any suitable number of MOS switches 224 can be used depending on the calibration requirements of the PLL 200.

A calibration cycle is initiated at the beginning of the operation of the PLL 200 (i.e., when the PLL 200 is switched OFF), in which the fourth switch S4 is switched ON, causing the band gap voltage source 220 to charge the capacitor 212 to about the voltage level of the control voltage. After the charging is complete, the fourth switch S4 is switched OFF, and the voltage comparator circuit 218 compares the voltage across the capacitor 212 (at the positive terminal thereof) with the reference voltage (at the negative terminal thereof). When the charge across the capacitor 212 drops with time, the voltage at the positive terminal of the voltage comparator circuit 218 becomes less than the reference voltage at the positive terminal thereof and the voltage comparator circuit 218 generates a difference voltage. The state machine 222 receives the difference voltage and generates the calibration bits accordingly.

The calibration bits are provided to respective gate terminals of the MOS switches 224b-224d, to control the ON/OFF switching thereof. The ON/OFF switching of the MOS switches 224b-224d causes an appropriate magnitude of current to flow from the core voltage supply 226 to the capacitor 212, which compensates the charge leakage across the capacitor 212.

In various embodiments of the present invention, the state machine 222 is programmed to generate a pattern of the calibration bits based on the magnitude of the desired control voltage, which in term depends on the desired frequency of the oscillator signal. If the charge compensation circuit 216 is not able to generate sufficient current to compensate the charge leakage of the capacitor 212 in the first calibration cycle, the calibration cycle is repeated and the state machine 222 is re-programmed to generate a different pattern of calibration bits on receiving the difference voltage from the voltage comparator circuit 218. The calibration cycle is stopped when the state machine 222 generates calibration bits that cause the charge compensation circuit 216 to completely compensate the charge leakage of the capacitor 212.

After the calibration is complete, the PLL 200 resumes normal operation in which the fourth switch S4 remains switched OFF. When the electronic circuit enters the LOW POWER mode, the charge compensation circuit 216 continuously monitors the charge leakage across the capacitor 212, and compensates the charge leakage accordingly to keep the capacitor 212 charged to about the control voltage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What claimed is:

1. A phase-locked loop (PLL) for generating an oscillator signal, comprising:
    a phase-frequency detector (PFD) for generating an error signal based on an input reference signal and a feedback signal;
    a charge pump, connected to the PFD, for generating a charge pump current based on the error signal;
    a low pass filter having an input terminal connected to the charge pump, for generating a control voltage based on the charge pump current;
    a voltage-controlled oscillator (VCO), connected to an output terminal of the low pass filter, for generating the oscillator signal based on the control voltage;
    a frequency divider, connected between the VCO and the PFD, for generating the feedback signal by adjusting a frequency of the oscillator signal;
    a capacitor having a first terminal connected to the output terminal of the low pass filter and a second terminal connected to ground, wherein the capacitor is charged to about a voltage level of the control voltage by the low pass filter; and
    a buffer amplifier having an input terminal connected to the first terminal of the capacitor and an output terminal connected to the input terminal of the low pass filter, for buffering a voltage across the capacitor;
    wherein, the voltage across the capacitor is provided to the low pass filter when the PLL transitions from a STOP mode to a RUN mode, to reduce time taken by the VCO to generate the oscillator signal.

2. The PLL of claim 1, further comprising a first switch connected between the output terminal of the low pass filter and the first terminal of the capacitor, to control the charging of the capacitor when the PLL is in the RUN mode.

3. The PLL of claim 2, further comprising a second switch connected between the first terminal of the capacitor and the buffer amplifier, to control the buffering of the voltage across the capacitor when the PLL is in the STOP mode.

4. The PLL of claim 3, further comprising a third switch connected between the buffer amplifier and the input terminal of the low pass filter, to control the supply of the voltage across the capacitor to the low pass filter when the PLL transitions from the STOP mode to the RUN mode.

5. The PLL of claim 4, further comprising a charge compensation circuit coupled to the capacitor, wherein the charge compensation circuit comprises:
   a band gap voltage source for generating a band gap voltage;
   a voltage comparator circuit having an input terminal connected to the first terminal of the capacitor and an inverted terminal connected to the band gap voltage source;
   a state machine having an input terminal connected to an output terminal of the voltage comparator circuit, wherein the state machine generates one or more calibration bits based on a difference between the band gap voltage and the voltage across the capacitor; and
   one or more switches connected to corresponding ones of the one or more calibration bits, for selectively providing a compensation current to the first terminal of the capacitor, wherein the compensation current compensates a charge leakage of the capacitor when the PLL is in the STOP mode.

6. The PLL of claim 5, wherein the state machine comprises a digital combinational logic circuit.

7. The PLL of claim 5, wherein the band gap voltage source is further connected to the first terminal of the capacitor, to charge the capacitor to about the control voltage during a calibration cycle of the PLL, wherein the calibration cycle is performed when the PLL is in the STOP mode.

8. The PLL of claim 7, further comprising a fourth switch connected between the band gap voltage source and the first terminal of the capacitor, to control the charging of the capacitor during the calibration cycle.

9. The PLL of claim 8, wherein the calibration cycle comprises programming the one or more calibration bits into the state machine based on the charge leakage of the capacitor.

10. The PLL of claim 1, wherein the buffer amplifier is a unity gain amplifier.

11. An electronic circuit, comprising:
   a phase-locked loop (PLL) for generating and providing an oscillator signal to the electronic circuit, wherein the PLL is switched OFF when the electronic circuit is in a LOW POWER mode and switched ON when the electronic circuit transitions from the LOW POWER mode to a RUN mode, and wherein the PLL comprises:
      a phase-frequency detector (PFD) for generating an error signal based on an input reference signal and a feedback signal;
      a charge pump, connected to the PFD, for generating a charge pump current based on the error signal;
      a low pass filter having an input terminal connected to the charge pump, for generating a control voltage based on the charge pump current;
      a voltage-controlled oscillator (VCO), connected to an output terminal of the low pass filter, for generating the oscillator signal based on the control voltage;
      a frequency divider, connected between the VCO and the PFD, for generating the feedback signal by adjusting a frequency of the oscillator signal;
      a capacitor having a first terminal connected to the output terminal of the low pass filter and a second terminal connected to ground, wherein the capacitor is charged to about a voltage level of the control voltage by the low pass filter; and
      a buffer amplifier having an input terminal connected to the first terminal of the capacitor for buffering a voltage across the capacitor, and an output terminal connected to the input terminal of the low pass filter;
      wherein, the voltage across the capacitor is provided to the low pass filter when the PLL is switched ON, to reduce time taken by the VCO to generate the oscillator signal, thereby further reducing time taken by the electronic circuit to transition from the LOW POWER mode to the RUN mode.

12. The electronic circuit of claim 11, further comprising a first switch connected between the output terminal of the low pass filter and the first terminal of the capacitor, to control the charging of the capacitor when the PLL is in the ON state.

13. The electronic circuit of claim 12, further comprising a second switch connected between the first terminal of the capacitor and the buffer amplifier, to control the buffering of the voltage across the capacitor when the PLL is in the OFF state.

14. The electronic circuit of claim 13, further comprising a third switch connected between the buffer amplifier and the input terminal of the low pass filter, to control the supply of the voltage across the capacitor to the low pass filter when the PLL is switched ON.

15. The electronic circuit of claim 11, further comprising a charge compensation circuit coupled to the capacitor, wherein the charge compensation circuit comprises:
   a band gap voltage source for generating a band gap voltage;
   a voltage comparator circuit having an input terminal connected to the first terminal of the capacitor and an inverted terminal connected to the band gap voltage source;
   a state machine having an input terminal connected to an output terminal of the voltage comparator circuit, wherein the state machine generates one or more calibration bits based on a difference between the band gap voltage and the voltage across the capacitor; and
   one or more switches connected to corresponding ones of the one or more calibration bits, for selectively providing a compensation current to the first terminal of the capacitor, wherein the compensation current compensates a charge leakage of the capacitor when the PLL is in the OFF state.

16. The electronic circuit of claim 15, wherein the band gap voltage source is further connected to the first terminal of the capacitor, to charge the capacitor during a calibration cycle of the PLL, wherein the calibration cycle is performed when the PLL is in the OFF state.

17. The electronic circuit of claim 16, further comprising a fourth switch connected between the band gap voltage source and the first terminal of the capacitor, to control the charging of the capacitor during the calibration cycle.

18. The electronic circuit of claim 17, wherein the calibration cycle includes programming the one or more calibration bits into the state machine based on the charge leakage of the capacitor.

19. The electronic circuit of claim 11, wherein the buffer amplifier is a unity gain amplifier.

20. A phase-locked loop (PLL) for generating an oscillator signal, comprising:

a phase-frequency detector (PFD) for generating an error signal based on an input reference signal and a feedback signal;

a charge pump, connected to the PFD, for generating a charge pump current based on the error signal;

a low pass filter having an input terminal connected to the charge pump, for generating a control voltage based on the charge pump current;

a voltage-controlled oscillator (VCO), connected to an output terminal of the low pass filter, for generating the oscillator signal based on the control voltage;

a frequency divider, connected between the VCO and the PFD, for generating the feedback signal by adjusting a frequency of the oscillator signal;

a capacitor having a first terminal connected to the output terminal of the low pass filter and a second terminal connected to ground, wherein the capacitor is charged to about a voltage level of the control voltage by the low pass filter;

a buffer amplifier having an input terminal connected to the first terminal of the capacitor for buffering a voltage across the capacitor, and an output terminal connected to the input terminal of the low pass filter;

wherein, the voltage across the capacitor is provided to the low pass filter when the PLL transitions from a STOP mode to a RUN mode, to reduce time taken by the VCO to generate the oscillator signal;

a band gap voltage source for generating a band gap voltage;

a voltage comparator circuit having an input terminal connected to the first terminal of the capacitor and an inverted terminal connected to the band gap voltage source;

a state machine having an input terminal connected to an output terminal of the voltage comparator circuit, wherein the state machine generates one or more calibration bits based on a difference between the band gap voltage and the voltage across the capacitor; and one or more switches connected to corresponding ones of the one or more calibration bits, for selectively providing a compensation current to the first terminal of the capacitor, wherein the compensation current compensates a charge leakage of the capacitor when the PLL is in the STOP mode.

* * * * *